(12) United States Patent
Bringivijayaraghavan et al.

(10) Patent No.: US 8,441,888 B2
(45) Date of Patent: *May 14, 2013

(54) WRITE COMMAND AND WRITE DATA TIMING CIRCUIT AND METHODS FOR TIMING THE SAME

(75) Inventors: Venkatraghavan Bringivijayaraghavan, Plano, TX (US); Jason Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 103 days.

This patent is subject to a terminal disclaimer.

(21) Appl. No.: 13/149,435

(22) Filed: May 31, 2011

(65) Prior Publication Data

US 2011/0228625 A1  Sep. 22, 2011

Related U.S. Application Data

(63) Continuation of application No. 12/416,761, filed on Apr. 1, 2009, now Pat. No. 7,969,813.

(51) Int. Cl.
*G11C 8/00* (2006.01)

(52) U.S. Cl.
USPC ........... 365/230.08; 365/230.06; 365/236

(58) Field of Classification Search ............ 365/230.06, 365/230.08, 236, 189.05, 189.12, 189.16, 365/233.11, 233.16, 233.1
See application file for complete search history.

(56) References Cited

U.S. PATENT DOCUMENTS

| | | |
|---|---|---|
| 6,260,128 B1 | 7/2001 | Ohshima et al. |
| 6,438,055 B1 | 8/2002 | Taguchi et al. ............ 365/222 |
| 6,510,095 B1 | 1/2003 | Matsuzaki et al. |
| 6,687,185 B1 | 2/2004 | Keeth et al. |
| 6,744,285 B2 | 6/2004 | Mangum et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,058,799 B2 | 6/2006 | Johnson |
| 7,170,819 B2 | 1/2007 | Szczypinski |
| 7,187,599 B2 | 3/2007 | Schnell et al. |
| 7,209,396 B2 | 4/2007 | Schnell |
| 7,269,754 B2 | 9/2007 | Ramaswamy et al. |

(Continued)

OTHER PUBLICATIONS

Related U.S. Appl. No. 13/543,698, filed Jul. 6, 2012.

(Continued)

*Primary Examiner* — Tuan T Nguyen
*Assistant Examiner* — Hien Nguyen
(74) *Attorney, Agent, or Firm* — Dorsey & Whitney LLP

(57) ABSTRACT

Circuits, memories, and methods for latching a write command and later provided write data including write command and write data timing circuits. One such timing circuit includes internal write command latch to latch an internal write command in response to write command latch signal. The internal write command latch releases the latched write command in response to the write command latch signal after a latency delay. The timing circuit further includes a write leveling flip-flop (FF) circuit and a write data register. One such method includes generating and latching an internal write command. The latched internal write command is released after a latency delay responsive to the memory clock signal. The internal write command is propagated over an internal write command path. Write data is captured and internal write command latched in response to a write clock signal. The captured write data is released to be written to memory.

23 Claims, 5 Drawing Sheets

U.S. PATENT DOCUMENTS

| | | |
|---|---|---|
| 7,280,430 B2 | 10/2007 | Lee |
| 7,340,632 B2 | 3/2008 | Park |
| 7,375,560 B2 | 5/2008 | Lee et al. |
| 7,451,338 B2 | 11/2008 | Lemos |
| 7,631,248 B2 | 12/2009 | Zakharchenko et al. |
| 7,656,745 B2 | 2/2010 | Kwak |
| 7,660,187 B2 | 2/2010 | Johnson et al. |
| 7,663,946 B2 | 2/2010 | Kim |
| 7,716,510 B2 | 5/2010 | Kwak |
| 7,751,261 B2 | 7/2010 | Cho |
| 7,773,435 B2 | 8/2010 | Cho |
| 7,826,305 B2 | 11/2010 | Fujisawa |
| 7,872,924 B2 | 1/2011 | Ma .................... 365/189.05 |
| 7,913,103 B2 | 3/2011 | Gold et al. |
| 7,948,817 B2 | 5/2011 | Coteus et al. |
| 7,969,813 B2 * | 6/2011 | Bringivijayaraghavan et al. .................... 365/230.08 |
| 2001/0015924 A1 | 8/2001 | Arimoto et al. ............ 365/201 |
| 2003/0117864 A1 | 6/2003 | Hampel et al. |
| 2006/0155948 A1 | 7/2006 | Ruckerbauer |
| 2007/0033427 A1 | 2/2007 | Correale et al. |
| 2007/0088903 A1 | 4/2007 | Choi |
| 2008/0080271 A1 | 4/2008 | Kim |
| 2009/0315600 A1 | 12/2009 | Becker et al. |
| 2010/0001762 A1 | 1/2010 | Kim |
| 2010/0165769 A1 | 7/2010 | Kuroki .................... 365/203 |
| 2010/0165780 A1 | 7/2010 | Bains et al. |
| 2010/0195429 A1 | 8/2010 | Sonoda |
| 2010/0254198 A1 | 10/2010 | Bringivijayaraghavan et al. .................... 365/189.05 |
| 2011/0055671 A1 | 3/2011 | Kim et al. |
| 2011/0238941 A1 | 9/2011 | Xu et al. |

OTHER PUBLICATIONS

Related U.S. Appl. No. 13/074,972, filed Mar. 29, 2011.
Related U.S. Appl. No. 13/093,640, filed Apr. 25, 2011.
Related U.S. Appl. No. 13/364,198, filed Feb. 1, 2012.
Related U.S. Appl. No. 13/486,674, filed Jun. 1, 2012.
Related U.S. Appl, No. 13/531,341, filed Jun. 22, 2012.
Notificiation of International Search Report and Written Opinion dated May 7, 2012 for International Application No. PCT/US2012/027672, May 7, 2012, 1-9.
"Interfacing DDR SDRAM with Stratix II Devices", Version 3.2, Altera Corp, Sep. 2008.
Lee, "How to Implement DDR SGRAM in Graphic System", Samsung Electric, 1998.

* cited by examiner

WRITE COMMAND AND WRITE DATA TIMING CIRCUIT AND METHODS FOR TIMING THE SAME

CROSS REFERENCE TO RELATED APPLICATION(S)

This application is a continuation of U.S. patent application Ser. No. 12/416,761, filed Apr. 1, 2009, U.S. Pat. No. 7,969,813, which application is incorporated herein by reference, in its entirety, for any purpose.

TECHNICAL FIELD

Embodiments of the invention relate generally to semiconductor memory, and more specifically, to timing internal clock and control signals for executing memory commands in a high-speed memory clock system.

BACKGROUND OF THE INVENTION

In semiconductor memory, data is written to memory for storage until read at a later time. Writing data typically involves issuing a write command to the memory and also providing the write data that is to be written to memory. The write data can be provided to the memory at a time after the write command is issued to allow operations internal to the memory device to occur for the write command to be executed. The timing between the issuance of the write command and its write data to the memory are related by "write latency." As known, write latency is the delay, in clock cycles, from the issuance of a write command to the latching of the first write data. An example of typical write latency is 12 clock cycles of the Clk signal.

Correct timing of internal timing signals generated in response to external command and clock signals is critical for proper operation of the memory. Complicating the generating of correctly timed internal signals is the relatively high frequency of memory clock signals. For example, memory clock signals can exceed 1 GHz. Further complicating the matter is that multi-data rate memories can provide and receive data at a rate higher than the memory clock signal. With respect to write commands, a write clock signal may be provided to the memory for correctly timing the rate at which write data is received by the memory. Correctly timing internal write operations relative to the receipt of the write command, write data, memory clock signal and write clock signal is required to properly complete a write operation.

The traditional method of timing the write data with the memory clock is modeling both the write clock path and the system clock path to have the same propagation delay. With higher-speed clock signals, however, the propagation delay of the clock paths may be on the order of several clock cycles, thus, preventing write throughput from being optimized. Additionally, the propagation delay can often vary due to power, voltage, and temperature conditions. In cases where the memory clock is a lower frequency than the write clock, tight phase control between the memory clock and the write clock is necessary for correct operation, which is complicated by the total propagation delay time and the variation in the delay due to power, voltage, and temperature conditions.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
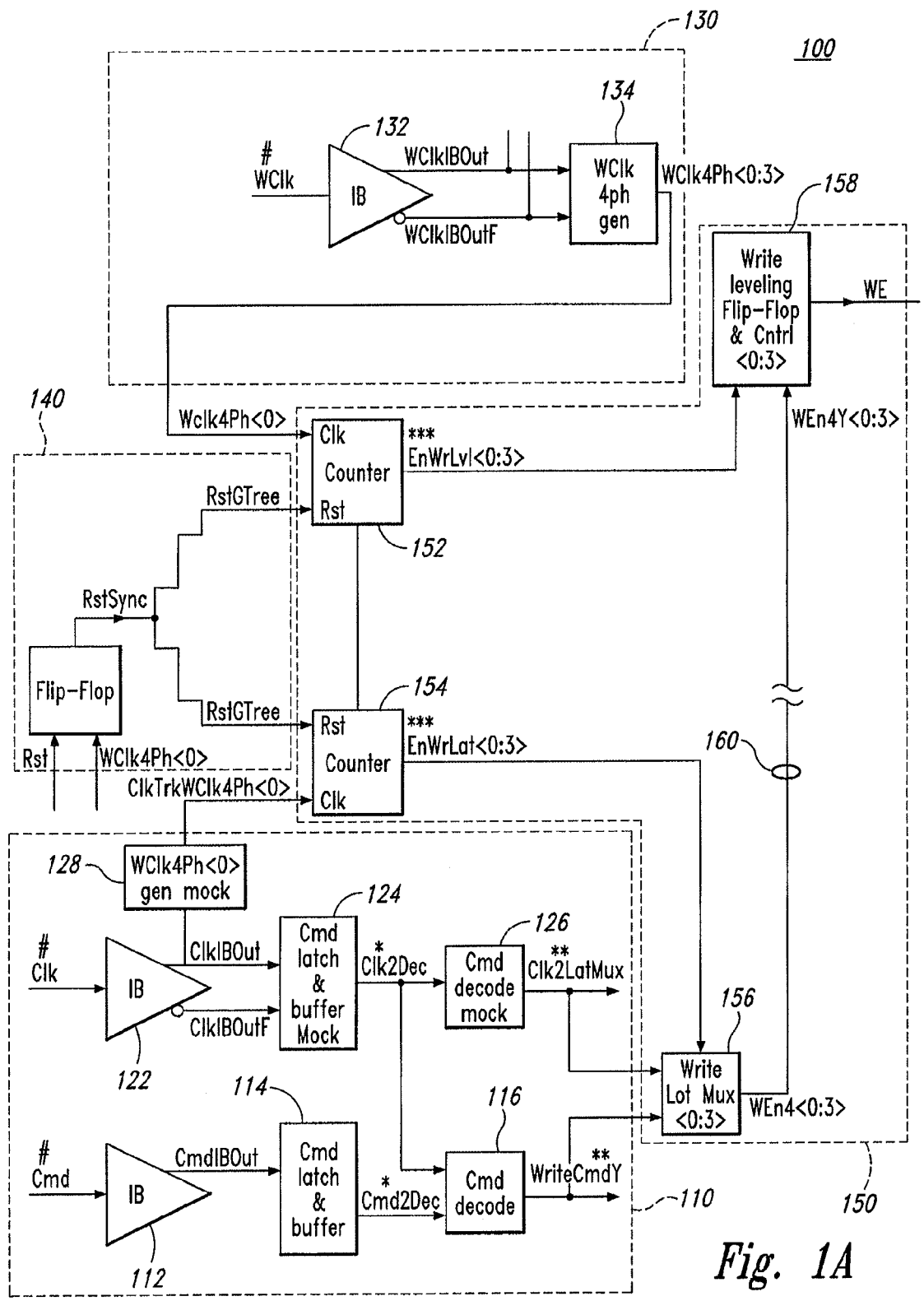
FIG. 1A is a block diagram of a write command-data timing circuit according to an embodiment of the invention.

FIG. 1A illustrates a write command-data timing circuit 100 according to an embodiment of the invention. The timing circuit 100 includes a memory clock and command buffer and clock circuit 110. The buffer and clock circuit 110 includes a command buffer 112 that buffers memory command signals Cmd and provides the buffered command signals CmdIBOut to a command latch 114 that captures the CmdIBOut signals. The captured CmdIBOut is provided to a command decoder 116 that decodes the CmdIBOut and generates internal device signals to carry out the decoded command. In the case for a write command, the command decoder 116 generates internal write command signals WriteCmdY.

The buffer and clock circuit 110 further includes a memory clock buffer 122 that buffers the memory clock signal Clk and provides complementary buffered memory clock signals ClkIBOut, ClkIBOutF to a command latch and buffer model delay circuit 124. The model delay circuit 124 models the propagation delay of the command latch and buffer 114. The command latch and buffer model delay circuit 124 outputs an internal clock signal Clk2Dec to a command decoder model delay circuit 126, which models the propagation delay of the command decoder 116. The Clk2Dec signal is propagated through the command decoder model delay circuit 126 and provided as a write latency multiplexer clock signal Clk2LatMux. In some embodiments, the Clk2LatMux signal has the same frequency Clk signal. The model delay circuits 124, 126 approximate the delay through the command latch and buffer 114 and the command decoder 116 so that the WritecmdY and Clk2LatMux signals are roughly synchronized.

A multi-phase write clock generator model delay circuit 128 coupled to the memory clock buffer 122 is also included in the buffer and clock circuit 110. The model delay circuit 128 provides a delayed clock signal ClkTrkWClk4Ph<0> in response to receiving the ClkIBOut signal from the input buffer 122. As will be explained in more detail below, the model delay circuit 128 models the propagation delay of a multi-phase clock generator for a write clock signal. The Clk and Cmd signals provided to the buffer and clock circuit 110 are considered to be in a first clock domain. That is, the Clk signal has a first clock domain frequency and the Cmd signals are latched according to the first clock domain frequency.

The timing circuit 100 further includes a write clock buffer and clock circuit 130. The buffer and clock circuit 130 include a write clock buffer 132 that buffers a write clock WClk and generates complementary buffered write clock signals WClkIBOut, WClkIBOutF. The WClkIBOut, WClkIBOutF signals are provided to a multi-phase clock generator 134 that generates clock signals having fixed phase relationships to one another. In some embodiments, such as the one shown in FIG. 1A, the multi-phase clock generator 134 is a four-phase clock generator that generates quadrature clock signals WClk4Ph<0:3> in response to the WClkIBOut, WClkIBOutF signals. That is, the four-phase clock generator 134 generates a 0 degree clock signal synchronized with the WC1kBOut signal, and further generates a 90 degree clock signal having a 90 degree phase relative to the 0 degree clock signal, a 180 degree clock signal and a 270 degree clock signal. In some embodiments, the clock frequencies of the multi-phase clock signals are the same clock frequency of the WClk signal. In some embodiments, the clock frequencies of the multi-phase clock signals can be greater or lower than the clock frequency of the WClk signal. Typically, the clock frequency of the multi-phase clock signals are the same clock frequency as the Clk signal.

The WClk signal provided to the buffer and clock circuit 130 is in a second clock domain. In some embodiments, the second clock domain may have the same clock frequency as clock signals in the first clock domain. In some other embodiments, the second clock domain may have a different clock frequency than clock signals in the first clock domain. For example, the WClk signal may have a clock frequency that is a multiple of the frequency of the Clk signal, such as twice the frequency of the Clk signal.

The timing circuit 100 further includes a write enable timing circuit 150. The timing circuit 150 includes clocked counter circuits 152, 154. The counter circuit 152 is clocked by the 0 degree clock signal WClk4Ph<0> from the multi-phase clock generator 134 and the counter circuit 154 is clocked by the ClkTrkWClk4Ph<0> signal from the buffer and clock circuit 110. Where the frequency of the WClk14Ph<0> and ClkTrkWClk4Ph<0> signals are the same, the counter circuits 152, 154 will count in synchronicity. In some embodiments, the output signals EnWrLvl<0:3> from the counter circuit 152 and EnWrLat<0:3> from the counter circuit 154 change values at a frequency that is four times the frequency of the Clk signal. A reset circuit 140 coupled to the counter circuits 152, 154 generates a reset signal RstGTree to reset the count of the counter circuits 152, 154 so that the counts of the two counter circuits 152, 154 correspond to one another in response to the respective clock signals.

Each of the counter circuits 152, 154 change the value of a binary digit of the count in response to the respective clock signal. For example, assuming that four-bit counter circuits are used for the counter circuits 152, 154, in response to a rising edge of the WClk4Ph<0> signal the counter circuit 152 generates an output signal EnWrLvl<0:3> representing the binary number 1000. In response to a next rising edge of the WClk4Ph<0> signal the counter circuit 152 generates an output signal EnWrLvl<0:3> representing the binary number 0100. The next binary number generated by the counter circuit 152 is 0010 and the following binary number is 0001. In response to the fifth rising edge of the WClk4Ph<0> signal the counter circuit 152 generates an output signal EnWrLvl<0:3> representing the binary number 1000. The counter circuit 154 operates similarly in response to the ClkTrkWClk4Ph<0> signal and generates an output signal EnWrLat<0:3> representing the binary number.

The timing circuit 150 further includes a write latency multiplexer 156. The write latency multiplexer 156 delays the propagating WriteCmdY signal to account for write latency and latches the WriteCmdY from the command decoder 116 in response to the EnWrLat<0:3> signal at a "position" corresponding to the value of EnWrLat<0:3>. The captured WriteCmdY signal is then released from the write latency multiplexer 156 as a write command enable signal WEn4<0:3> in response to a subsequent occurrence of the EnWrLat<0:3> signal having the same value as its respective latched position. That is, if the EnWrLat<0:3> signal that clocks the write latency multiplexer 156 is 0010, the WriteCmdY signal is latched into the 0010 position. At a subsequent occurrence of the EnWrLat<0:3> signal having a value of 0010, the WriteCmdY signal at the 0010 position is released as a Wen4<0:3> signal. In some embodiments, the write latency multiplexer 156 has four positions and is implemented using four latches, each latch clocked by one of the EnWrLat<0:3> signals.

Figure 1B:
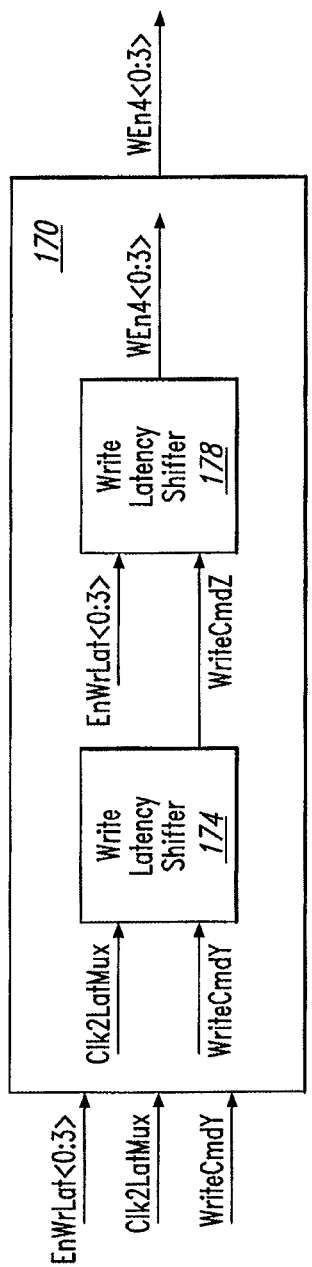
FIG. 1B is a block diagram of a write latency multiplexer of FIG. 1A according to an embodiment of the invention.

FIG. 1B illustrates a write latency multiplexer 170 according to an embodiment of the invention. The write latency multiplexer 156 (FIG. 1A) may be implemented as the write latency multiplexer 170. The write latency multiplexer 170 includes a write latency shifter 174 and a write latency shifter 178. The WriteCmdY signal is shifted through a write latency shifter 174 in response to the Clk2LatMux signal to provide appropriate delay due to write latency. As previously discussed, write latency is the delay, in clock cycles, from the issuance of a write command to the latching of the first write data. Examples of typical write latency are between 12 and 16 clock cycles of the Clk signal. In an embodiment where a four clock cycle timing margin for synchronizing write data and propagation of a write command is used, the write latency shifter 174 may provide between 8 and 12 clock cycles of delay. After being shifted through the write latency shifter 174, the WriteCmdY signal is output to the write latency shifter 178 as the WriteCmdZ signal. The WriteCmdZ signal is captured by the write latency shifter 178 in response to the EnWrLat<0:3> signals. The WriteCmdZ signal is released from the write latency shifter 178 as the WEn4<0:3> signal in response to the EnWrLat<0:3> signal having a value corresponding to the position in which the WriteCmdZ signal was captured in the write latency shifter 178. The resulting WEn4<0:3> signal has a value indicative of the latched position of the write command.

For example, in the previously discussed example, the WriteCmdY signal is provided to the write latency multiplexer 170 and is shifted through the write latency shifter 174 in response to the Clk2LatMux signal. After the WriteCmdY signal is shifted through the write latency shifter 174 and is output as the WriteCmdZ signal, the write latency shifter 178 captures the WriteCmdZ signal at a latched position determined by the EnWrLat<0:3> signal. In the previously discussed example, the WriteCmdZ signal is captured in response to a EnWrLat<0:3> signal of 0010. The next occurrence of the EnWrLat<0:3> signal having a value of 0010 will cause the write latency shifter 178 to output the captured WriteCmdZ signal as a corresponding write command enable signal WEn4<0:3> having a value indicative of the latched position from which it was released. In the present example the WEn4<0:3> signal will have a value of 0010.

The released WEn4<0:3> signal is provided over a signal path 160 to a write leveling flip-flop (FF) and control circuit 158. The signal path 160 may introduce a propagation delay to the WEn4<0:3> signal as it is transmitted to the FF and control circuit 158. The propagation delay of the signal path may not be matched to a propagation delay of a write data path over which write data is transmitted, as will be explained in more detail below. The FF and control circuit 158 latches the WEn4<0:3> signal in response to the EnWrLvl<0:3> signal provided by the counter circuit 152. Where the latched WEn4<0:3> signal includes an indication of a write command, the FF and control circuit 158 generates an internal write enable signal WE. As will be described in more detail below, the WE signal can be used to time the latching of write data.

The WEn4<0:3> signal of a value is latched by the FF and control circuit 158 in response to a EnWrLvl<0:3> signal having the same value. For example, in the previously discussed example where the WEn4<0:3> signal is released by the write latency multiplexer 156 in response to a EnWrLat<0:3> signal of 0010, the WEn4<0:3> signal arrives at the FF and control circuit 158 after the propagation delay of the signal path 160 and is latched by the FF and control circuit 158 in response to a EnWrLvl<0:3> signal having a value of 0010. As previously discussed, the counter circuits 152, 154 count in synchronicity and provide output signals having the same value, thus, typically the EnWrLvl<0:3> signal of 0010 that latches the WEn4<0:3> signal is the next occurrence after the EnWrLat<0:3> signal of 0010.

In some embodiments, the FF and control circuit 158 is implemented as a set of flip-flops where each of the flip-flops is coupled to receive a single bit of the WEn4<0:3> signal and clocked in response to one of the signals of the EnWrLvl<0:3> signal.

Figure 2:
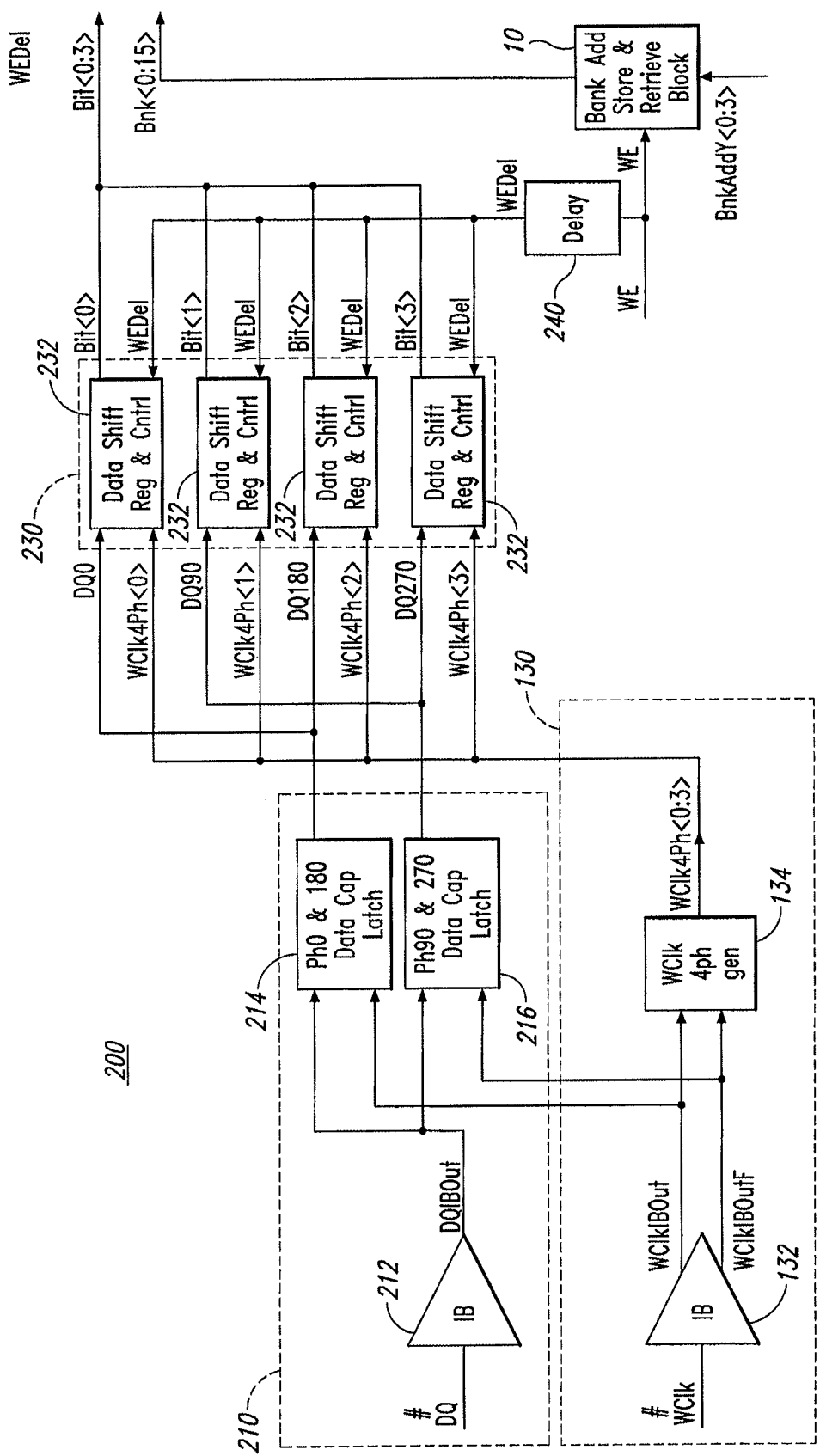
FIG. 2 is a block diagram of a data input circuit according to an embodiment of the invention.

FIG. 2 illustrates a data input circuit 200 according to an embodiment of the invention for one data node of a memory. That is, for a memory having four input-output (IO) nodes, the data input circuit 200 is replicated for each of the IO nodes. The data input circuit 200 includes a write data buffer and latch circuit 210 and write clock buffer and clock circuit 130 that provides write data and the write clock signal for latching of the write data. The write clock buffer and clock circuit 130 may be the same clock circuit as shown in FIG. 1A. The data input circuit 200 further includes a data register 230 that latches the write data in response to the write clock signal and provides the latched write data for writing to the memory array in response to a delayed internal write enable signal WEDel. The WEDel signal is generated by delaying the WE signal output from the write leveling FF and control circuit 158 through a delay circuit 240.

The write data buffer and latch circuit 210 includes a write data buffer 212 that buffers the write data signals DQn to provide a buffered write data signal DQIBOut. Write data latches 214, 216 capture the write data and provide the data to the data register 230. The write clock buffer and clock circuit 130 include a write clock buffer 132 to generate complementary buffered write clock signals WClkIBOut, WClkIBOutF that are provided to a multi-phase clock signal generator 134. As previously discussed, a multi-phase clock signal generator generates various clock signals having fixed phase relationships in response to an input clock signal. In some embodiments of the invention, for example, the embodiment shown in FIG. 2, the multi-phase clock signal generator 130 is a four-phase clock signal generator for generating quadrature clock signals WClk4Ph<0:3>. In other embodiments of the invention, the multi-phase clock signal generator 134 may generate greater or fewer clock signals.

The multi-phase clock signals generated by the multi-phase clock signal generator 134 are used to clock data shift registers 232 of the data register 230 to capture the write data from the write data latches 214, 216. In some embodiments, such as the embodiment illustrated in FIG. 2, four data shift registers 232 are clocked by a respective one of the quadrature clock signals generated by a four-phase clock signal generator. The data shift registers 232 provide latched write data to be written to the memory array in response to the WEDel signal provided from the delay circuit 240, which results from the WE signal generated by the write enable timing circuit 150 (FIG. 1A).

A bank address store 10 is illustrated in FIG. 2. The bank address store 10 releases a bank address for a write command so that the write data corresponding to the write command is written to the correct bank of memory. The bank address store 10 releases the bank address for a write operation in response to the WE signal output by the write enable timing circuit 150.

Figure 3:
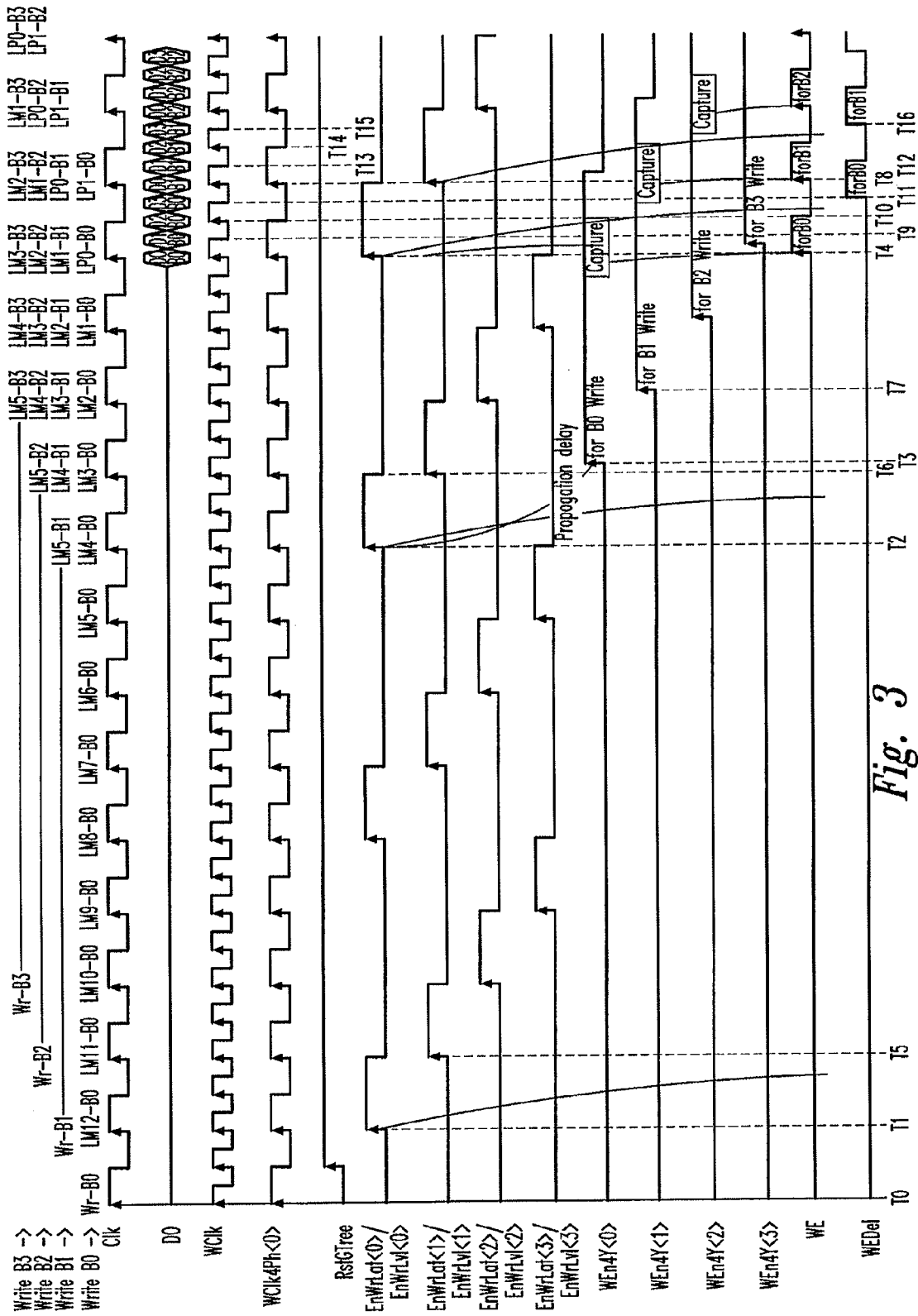
FIG. 3 is a timing diagram of various signals during operation of the write command-data timing circuit and the data input circuit according to an embodiment of the invention.

Operation of the timing circuit 100 circuit and the data input circuit 200 will be described with reference to FIGS. 1 and 2, and the timing diagram of FIG. 3. Generally, a WE signal that is used for latching write data and providing the write data to be written to memory is generated by the write leveling FF and control circuit 158 for every write command latched by the write latency multiplexer 156. The WE signal is generated in response to the EnWRLvl<0:3> signal when a corresponding write command enable signal WEn4<0:3> is provided to the FF and control circuit 158.

At time T0 (FIG. 3) a write command Wr-B0 to Bank0 of the memory array is received by the memory device. Although not shown in FIG. 3, the Wr-B0 signal is buffered and decoded by the memory clock and command buffer and clock circuit 110 to be provided as a WriteCmdY signal to the write latency multiplexer 156. At time T1, the rising edge of the EnWrLat<0> signal clocks the write latency multiplexer 156 to latch the WriteCmdY signal corresponding to the Wr-B0 command. As previously discussed, the latched WriteCmdY signal is shifted through a write latency buffer (not shown) in the write latency multiplexer 156 to provide appropriate delay due to write latency. For the present example, it is assumed the write latency is 12 clock cycles of the Clk signal and the latched WriteCmdY signal is shifted through the write latency buffer for eight clock cycles of the Clk signal. The write latency buffer shifts the WriteCmdY signal in response to the Clk2LatMux signal (not shown in FIG. 3) and EnWrLat<0:3> generated in response to the Clk signal.

After shifting through the write latency buffer, the latched WriteCmdY signal is then output by the write latency multiplexer 156 as a WEn4Y<0> signal in response to the rising edge of the EnWrLat<0> signal at time T2. As previously discussed, the WriteCmdY signal that is latched by a particular value of EnWrLat<0:3> signal is released as a WEn4Y signal from the write latency multiplexer 156 in response to an EnWrLat<0:3> signal having the same value at a later time. In the particular case of the Wr-B0 command, the corresponding WriteCmdY signal is latched by the rising edge of the EnWrLat<0> signal, and consequently, is released as the WEn4Y<0> signal in response to a later rising edge of the EnWrLat<0> signal.

The released WEn4Y<0> signal is propagated over the signal path 160 to the write leveling FF and control circuit 158. As previously discussed, the signal path has an inherent propagation delay that delays the arrival of the released WriteCmdY signal. As shown in FIG. 3, the WEn4Y<0> signal arrives at the FF and control circuit 158 at time T3. The time difference between T2 and T3 represents the propagation delay of the signal path 160.

At time T4, the counter circuit 152 counts to a value equal to the EnWrLat<0> signal and the rising edge of the resulting EnWrLvl<0> signal causes the WEn4Y<0> signal to be captured by the to the FF and control circuit 158. As previously discussed, the WEn4Y<0> signal released by the write latency multiplexer 156 in response to the EnWrLat<0> signal is latched by the corresponding EnWrLvl<0> signal (i.e., the EnWrLvl signal having the same value as the EnWrLat<0> signal). The capture of the released WEn4Y<0> signal in response to the EnWrLvl<0> signal results in a HIGH transition of the WE signal output by the FF and control circuit 158 at time T4.

The latching, release, and capture of write commands Wr-B1, Wr-B2, Wr-B3 for memory banks 1, 2, 3 are similar to that previously described for the Wr-B0 command. For example, at time T1 the Wr-B1 command is received by the memory device. The Wr-B1 command is buffered and decoded by the memory clock and command buffer and clock circuit 110 and provided to the write latency multiplexer 156 as a WriteCmdY signal. The WriteCmdY signal corresponding to the Wr-B1 command is latched at time T5 by the rising edge of the EnWrLat<1> signal. As previously described, an earlier WriteCmdY signal corresponding to the Wr-B0 command was previously latched by the EnWrLat<0> signal at time T1.

The WriteCmdY signal for the Wr-B1 command is shifted through the write latency buffer in response to the Clk2LatMux signal and EnWrLat<0:3>. After shifting through the write latency buffer, the latched WriteCmdY for the Wr-B1 command is released from the write latency multiplexer circuit 156 as the WEn4Y<1> signal upon a later occurrence of the rising edge of the EnWrLat<1> signal at time T6. The released WEn4Y<1> signal propagates over the signal path 160 and arrives at the FF and control circuit 158 at time T7. Upon the next occurrence of a rising edge of the EnWrLvl<0:3> signal having a value equal to the EnWrLat<1> signal, the WEn4Y<1> signal is captured by the FF and control circuit 158. At time T8, the EnWrLvl<1> signal, corresponding in value to the EnWrLat<1> signal, causes the FF and control circuit 158 to capture the WEn4Y<1> signal and results in a HIGH transition of the WE signal at time T8.

The rising edges of the WE signal generated by the FF and control circuit 158 may be used to release latched write data, as will be described in the operation of the data input circuit 200.

As previously discussed, the write latency for the present example is assumed to be 12 clock cycles of the Clk signal. That is, the write data for a write command is provided to the memory device 12 clock cycles of the Clk signal after the corresponding write command is issued. It is additionally assumed for the present example that the write clock WClk has a frequency twice that of the Clk signal.

The first bit of the write data for the Wr-B0 command is provided at time T4 to the input data buffer and latch 210 (FIG. 2) and the buffered write data is provided to the write data latches 214, 216. As known, the write data is provided to a input of the memory in serial fashion. Thus, the first bit of data is buffered and provided to both write data latches 214, 216. However, the 0-degree clock signal (not shown separately from the WClk signal in FIG. 3) generated by the multi-phase clock signal generator 134 clocks only the corresponding data register 232 of the data register 230 at time T4 to latch the first bit of data from the write data latch 214. The second bit of write data for the Wr-B1command is provided at time T9, buffered and provided to both write data latches 214, 216. The 90-degree clock signal generated by the multi-phase clock signal generator 134 clocks only the corresponding data register 232 at time T9 to latch the second bit of data from the write data latch 216. The third and fourth bits of write data for the Wr-B0 command are provided and latched by a respective data register 232 at times T10 and T11, respectively.

As previously discussed, the timing circuit 100 generates a WE signal having a HIGH transition in response to a WEn4Y signal being captured by an EnWrLvl signal having a same value as the EnWrLat signal that releases the respective WEn4Y signal from the write latch and mutliplexer 156. With respect to the HIGH transition of the WE signal in response to the capture of WEn4Y<0> signal (corresponding to the Wr-B0 command) at time T4, the WE signal is delayed by the delay circuit 240 (FIG. 2) to provide a WEDel signal at time T12 that is timed to release the four-bits of write data latched in registers 232 to be written to the memory array. The bank address provided by the bank address store 10 in response to the HIGH transition of the WE signal in response to the WEn4Y<0> signal released the bank address (bank 0 for the Wr-B0 command) to activate the appropriate memory bank for writing of the write data released by the data registers 232 in response to the WEDel signal.

The write data for the Wr-B1 command is handled in the same manner as previously described for the write data for the Wr-B0 command. For example, the first bit of the write data for the Wr-B1 command is provided at time T8 to the input data buffer and latch 210 (FIG. 2) and the buffered write data is provided to the write data latches 214, 216. The 0-degree clock signal (not shown separately from the WClk signal in FIG. 3) generated by the multi-phase clock signal generator 134 clocks only the corresponding data register 232 of the data register 230 at time T8 to latch the first bit of data from the write data latch 214. The second bit of write data for the Wr-B1 command is provided at time T13, buffered and provided to both write data latches 214, 216. The 90-degree clock signal generated by the multi-phase clock signal generator 134 clocks only the corresponding data register 232 at time T13 to latch the second bit of data from the write data latch 216. The third and fourth bits of write data for the Wr-B1 command are provided and latched by a respective data register 232 at times T14 and T15, respectively.

The HIGH transition of the WE signal in response to the capture of WEn4Y<1> signal (corresponding to the Wr-B1 command) at time T8, the WE signal is delayed by the delay circuit 240 (FIG. 2) to provide a WEDel signal at time T16 that is timed to release the four-bits of write data latched in registers 232 to be written to the memory array. The bank address provided by the bank address store 10 in response to the HIGH transition of the WE signal in response to the WEn4Y<1> signal released the bank address (bank 1 for the Wr-B1 command) to activate the appropriate memory bank for writing of the write data released by the data registers 232 in response to the WEDel signal.

The write data for the Wr-B2 and Wr-B3 commands are handled in the same manner as previously described for the write data for the Wr-B0 and Wr-B1 commands.

In summary, clock signals from two different clock domains may be used to latch write data of a corresponding write command by generating a correctly timed internal write command signal WE used for capturing write data and providing the data to be written to the memory. As previously discussed, conventional techniques rely on designing clock signal paths for clock signals from two different clock domains to have similar propagation delays. This approach, however, is susceptible to variations in process, voltage, and temperature. In embodiments of the invention, the additional propagation delay experienced by the memory clock is hidden from the write clock so that the power, voltage, and temperature variations is not experienced by the write clock, and the clock signals can be synchronized.

The previous example described operation of the timing circuit 100 and the data input circuit 200 where write data is provided to and latched by the memory at four-times the frequency of the memory clock signal Clk. However, in some embodiments of the invention, the frequency at which write data is latched by the memory is greater or less than that previously described. Various modifications within the understanding of those ordinarily skilled in the art may be made in these embodiments. For example, where the frequency of the write data is n-times the frequency of the Clk signal, in some embodiments of the invention the multi-phase clock signal generator 134 of the write clock buffer and clock circuit 130 generates n clock signals, and additionally, the data register 230 includes n data shift registers 232 to latch the write data.

Figure 4:
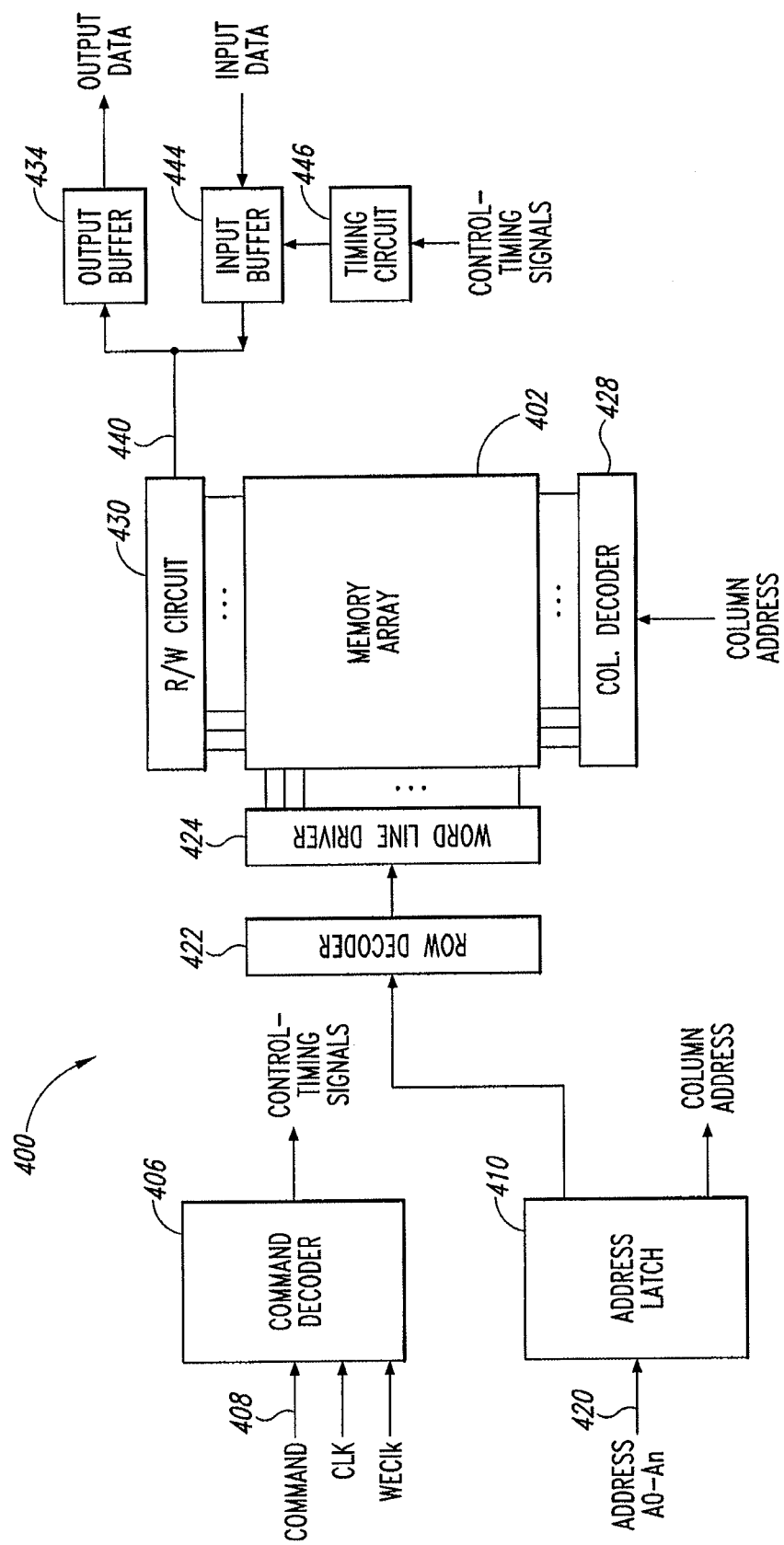
FIG. 4 is a block diagram of a memory device including a write command-data timing circuit according to an embodiment of the invention.

FIG. 4 illustrates a portion of a memory 400 according to an embodiment of the present invention. The memory 400 includes a write command-data timing circuit 446 according to an embodiment of the invention, for example, the write command-data timing circuit 100 of FIG. 1A. The memory 400 includes an array 402 of memory cells, which may be, for example, DRAM memory cells, SRAM memory cells, flash memory cells, or some other types of memory cells. The memory 400 includes a command decoder 406 that receives memory commands through a command bus 408 and generates corresponding control signals within the memory 400 to carry out various memory operations. The command decoder further receives a memory clock signal CLK and a write clock signal WClk and generates internal clock signals for operation of the memory. Row and column address signals are applied to the memory 400 through an address bus 420 and provided to an address latch 410. The address latch then outputs a separate column address and a separate row address.

The row and column addresses are provided by the address latch 410 to a row address decoder 422 and a column address decoder 428, respectively. The column address decoder 428 selects bit lines extending through the array 402 corresponding to respective column addresses. The row address decoder 422 is connected to word line driver 424 that activates respective rows of memory cells in the array 402 corresponding to received row addresses. The selected data line (e.g., a bit line or bit lines) corresponding to a received column address are coupled to a read/write circuitry 430 to provide read data to a data output buffer 434 via an input-output data bus 440. Write data are applied to the memory array 402 through a data input buffer 444 and the memory array read/write circuitry 430. A write command-data timing circuit 446 according to an embodiment of the invention is coupled to the data input buffer and receives control/timing signals from the command decoder 406. The timing circuit 446 provides timing signals that are used to latch write data of a corresponding write command by generating a correctly timed internal write command signal WE used for capturing write data providing the data to be written to the array 402. In some embodiments, the timing circuit 446 can provide timing signals for operation where the memory clock signal and the write clock signals are in two different time domains (e.g., different frequencies). The command decoder 406 responds to memory commands applied to the command bus 408 to perform various operations on the memory array 402. In particular, the command decoder 406 is used to generate internal control signals to read data from and write data to the memory array 402.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A command and data timing circuit, comprising:
    a first counter configured to increment a first count in accordance with a first clock domain;
    a second counter configured to increment a second count in accordance with a second clock domain;
    a first circuit coupled to the second counter, wherein the first circuit is configured to output a write command signal in response to the second count having a particular value; and
    a second circuit coupled to the first circuit and the first counter, wherein the second circuit is configured to latch the write command signal in response to the first count having the particular value, and wherein the second circuit is further configured to generate a write enable signal in response to latching the write command.

2. The command and data timing circuit of claim 1, further comprising:
    a third circuit coupled to the second circuit and configured to receive a set of data, the third circuit also configured to transmit the set of data in response to the enable signal.

3. The command and data timing circuit of claim 2, further comprising a delay element coupled between the second circuit and the third circuit and configured to delay the enable signal.

4. The command and data timing circuit of claim 1, wherein the second clock domain is in phase with the first clock domain.

5. The command and data timing circuit of claim 1, wherein the first counter and the second counter count in synchronicity.

6. The command and data timing circuit of claim 1, wherein the first clock domain is based on a first clock signal, and the second clock domain is based on a second clock signal, the second clock signal having twice the frequency as the first clock signal.

7. The command and data timing circuit of claim 1, wherein the first circuit generates the command signal in response to receiving an external command signal.

8. A system, comprising:
    a first circuit configured to capture an internal command in response to a first clock signal, and subsequently release the internal command in response to the first clock signal;
    a second circuit coupled to the first circuit and configured to capture the internal command in response to a second clock signal and generate an internal enable signal in response to capturing the internal command; and
    a register coupled to the second circuit and configured to capture data in response to a write clock signal and release the captured data in response to the internal enable signal.

9. The system of claim 8, wherein the second clock signal is derived from the write clock signal.

10. The system of claim 9, wherein the second clock signal is generated in a multi-phase clock generator based on the write clock signal.

11. The system of claim 8, wherein the register delays releasing the captured write data by a latency period.

12. The system of claim 8, wherein the internal command is generated in a third circuit in response to an external command, the third circuit coupled to the first circuit and configured to transmit the internal command to the first circuit.

13. The system of claim 8, wherein the captured write data is released to a memory array.

14. The system of claim 13, further comprising:
an address circuit, the address circuit coupled to the second circuit and configured to output a memory array address in response to the internal enable signal.

15. A method, comprising:
generating a first internal signal according to a first clock domain;
generating a second internal signal according to a second clock domain;
capturing a command in a first circuit according to the first clock domain, the command corresponding to a set of data bits;
propagating the command from the first circuit in the first clock domain to a second circuit in the second clock domain according to the first and second internal signals;
capturing the set of data bits according to the second clock domain; and
releasing the set of data bits in response to the propagated command.

16. The method of claim 15, wherein the set of data bits is captured in and released from a third circuit, further comprising:
propagating the command from the second circuit to the third circuit, the command enabling the third circuit to release the captured set of data bits.

17. The method of claim 15, wherein the propagating comprises delaying the command in a latch.

18. The method of claim 17, wherein the propagating comprising delaying the command in a plurality of latches.

19. The method of claim 15, wherein the first clock domain corresponds to a system clock.

20. The method of claim 15, wherein the set of data bits is captured serially.

21. The method of claim 15, wherein the set of data bits is released in parallel.

22. The method of claim 15, wherein the set of data bits is four bits.

23. The method of claim 15, wherein the command is a write command.

* * * * *